: US 7,790,047 B2
(45) Date of Patent: Sep. 7, 2010

(54) METHOD FOR REMOVING MASKING MATERIALS WITH REDUCED LOW-K DIELECTRIC MATERIAL DAMAGE

(75) Inventors: Zhilin Huang, San Jose, CA (US); Siyi Li, Fremont, CA (US); Qingjun Zhou, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 447 days.

(21) Appl. No.: 11/410,786

(22) Filed: Apr. 25, 2006

(65) Prior Publication Data

US 2007/0249172 A1 Oct. 25, 2007

(51) Int. Cl.
*H01L 21/302* (2006.01)

(52) U.S. Cl. .................... 216/41; 216/67; 438/714; 438/723; 438/734

(58) Field of Classification Search ............. 438/706, 438/710, 712, 714, 723, 724, 725; 216/58, 216/67
See application file for complete search history.

(56) References Cited

U.S. PATENT DOCUMENTS

| | | | | |
|---|---|---|---|---|
| 6,028,015 A * | 2/2000 | Wang et al. | ............... | 438/789 |
| 6,030,901 A * | 2/2000 | Hopper et al. | ............... | 438/711 |
| 6,105,588 A * | 8/2000 | Li et al. | ............... | 134/1.1 |
| 6,114,259 A * | 9/2000 | Sukharev et al. | ............... | 438/789 |
| 6,235,453 B1 * | 5/2001 | You et al. | ............... | 430/329 |
| 6,316,354 B1 * | 11/2001 | Hu | ............... | 438/652 |
| 6,413,877 B1 * | 7/2002 | Annapragada | ............... | 438/723 |
| 6,492,257 B1 * | 12/2002 | Shields et al. | ............... | 438/622 |
| 6,635,185 B2 * | 10/2003 | Demmin et al. | ............... | 216/64 |
| 6,647,994 B1 * | 11/2003 | Lui et al. | ............... | 134/1.2 |
| 6,673,721 B1 * | 1/2004 | Kim et al. | ............... | 438/725 |
| 6,951,823 B2 * | 10/2005 | Waldfried et al. | ............... | 438/710 |
| 7,029,992 B2 * | 4/2006 | Shieh et al. | ............... | 438/474 |
| 7,598,176 B2 * | 10/2009 | Tsai et al. | ............... | 438/694 |
| 2003/0104320 A1 * | 6/2003 | Nguyen et al. | ............... | 430/313 |
| 2006/0258148 A1 * | 11/2006 | Zhu et al. | ............... | 438/624 |
| 2006/0281312 A1 * | 12/2006 | Smith et al. | ............... | 438/689 |
| 2007/0054496 A1 * | 3/2007 | Paduraru et al. | ............... | 438/725 |

* cited by examiner

*Primary Examiner*—Anita K Alanko
(74) *Attorney, Agent, or Firm*—Moser IP Law Group

(57) ABSTRACT

Methods for removing masking materials from a substrate having exposed low-k materials while minimizing damage to exposed surfaces of the low-k material are provided herein. In one embodiment a method for removing masking materials from a substrate includes providing a substrate having exposed low-k materials and a masking material to be removed; exposing the masking material to a first plasma formed from a reducing chemistry for a first period of time; and exposing the masking material to a second plasma formed from an oxidizing chemistry for a second period of time. The steps may be repeated as desired and may be performed in reverse order. Optionally, at least one diluent gas may be added to the oxidizing chemistry.

25 Claims, 2 Drawing Sheets

METHOD FOR REMOVING MASKING MATERIALS WITH REDUCED LOW-K DIELECTRIC MATERIAL DAMAGE

BACKGROUND OF THE INVENTION

1. Field of the Invention

The present invention generally relates to the fabrication of integrated circuits and, more particularly, to a method for removing masking materials from dielectric materials having a low dielectric constant (hereinafter, low-k materials) during the fabrication of integrated circuits.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g., sub-micron dimensions), the materials used to fabricate such components have a greater impact on the electrical performance of the integrated circuit. For example, low resistivity metal interconnects (e.g., copper and aluminum) provide conductive paths between the components on integrated circuits. The metal interconnects are electrically isolated from each other by an insulating material. When the distance between adjacent metal interconnects and/or the thickness of the insulating material has sub-micron dimensions, capacitive coupling may occur between the metal interconnects, thereby causing cross talk and/or resistance-capacitance (RC) delay and degrading the overall performance of the integrated circuit. In order to reduce capacitive coupling between adjacent metal interconnects, low-k materials (e.g., dielectric constants less than about 4.0) are utilized.

Unfortunately, low-k materials are not easy to process using conventional fabrication techniques. In particular, low-k materials are susceptible to damage during plasma processing, such as plasma processing used to strip masking materials (i.e., photoresist layers) after a feature has been etched into a low-k material layer. For example, when using an oxygen plasma to remove photoresist, the oxygen reacts with and removes carbon and/or hydrogen near the surface of the exposed low-k materials, thereby damaging the low-k material. The alteration of the low-k material results in a low-k shift, wherein the dielectric constant of the material is changed.

In addition, this damage generally leads to further additional processing problems. For example, in a subsequent wet etch step to remove residue, such as a hydrofluoric acid (HF) dip, the damaged low-k material is undesirably removed as well. In fabrication processes such as forming interconnect structures or etching other features into the low-k materials, this causes a condition known as sidewall pull-back. Where less susceptible layers are also present, such as a capping layer that may be disposed over the low-k materials, the non-uniformity of the sidewall profile of the exposed low-k material forming part of the interconnect feature leads to difficulty in subsequent conductive material deposition steps required to complete the interconnect feature, potentially resulting in complete failure of the integrated circuit containing the defective interconnect structure.

Therefore, a need exists for an improved method of removing masking materials from low-k materials.

SUMMARY OF THE INVENTION

Methods for removing masking materials from a substrate having exposed low-k materials while minimizing damage to exposed surfaces of the low-k material are provided herein. In one embodiment, a method for removing masking materials from a substrate includes providing a substrate having exposed low-k materials and a masking material to be removed; exposing the masking material to a first plasma formed from a reducing chemistry for a first period of time; and exposing the masking material to a second plasma formed from an oxidizing chemistry for a second period of time. The steps may be repeated as desired and may be performed in reverse order. Optionally, at least one diluent gas may be added to the oxidizing chemistry.

In another embodiment, a method for removing a masking material from a substrate within a process chamber includes (a) providing a substrate having exposed low-k materials and a masking material to be removed; (b) performing one of: (b1) exposing the masking material to a first plasma formed from a reducing chemistry for a first period of time; or (b2) exposing the masking material to a second plasma formed from an oxidizing chemistry for a second period of time; (c) performing the step of (b1) or (b2) that was not performed in step (b); and (d) repeating the step initially performed in step (b).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention relate to methods of processing low-k materials and, in particular, to removing masking materials from substrates having exposed low-k dielectric materials.

Figure 1:
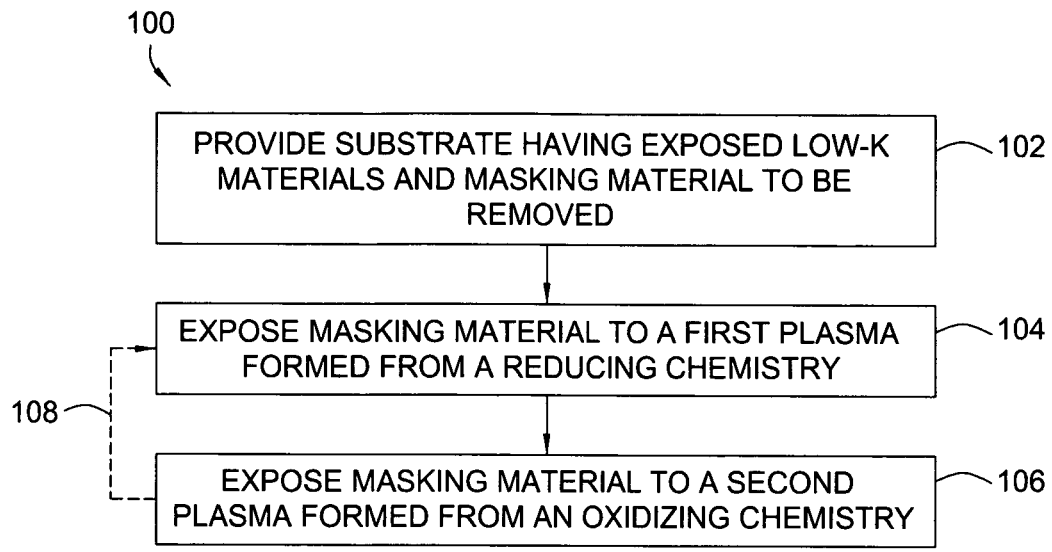
FIG. 1 depicts a sequence of method steps for removing masking materials disposed over low-k materials according to one embodiment of the invention described herein.
Figure 2A:
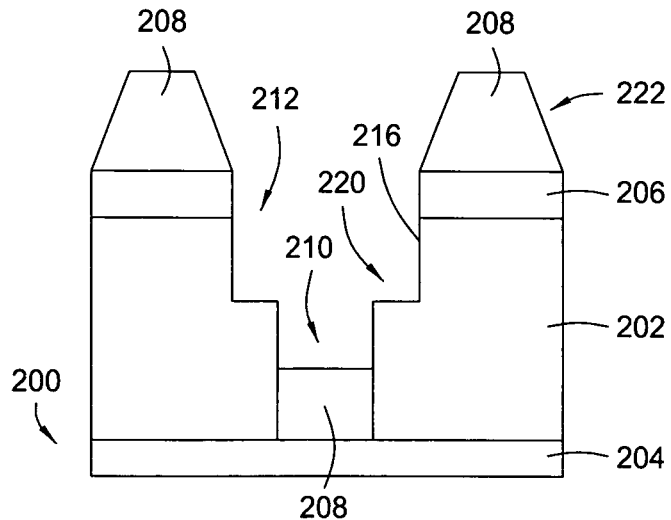
FIGS. 2A-2B are cross-sectional views of a substrate during different stages of a dual damascene interconnect processing sequence in accordance with one embodiment of the subject invention.
Figure 2B:
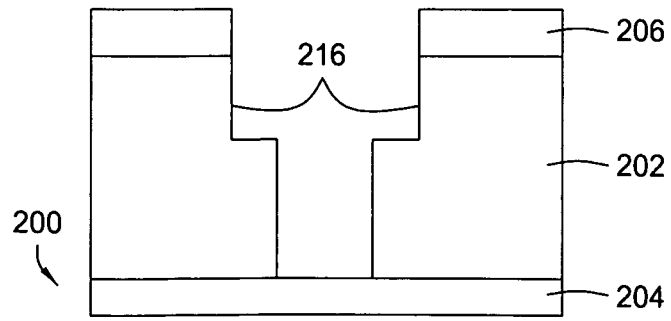

FIG. 1 depicts a method 100 of method steps that may be used to remove masking materials from a low-k material according to one embodiment of the invention. FIGS. 2A-B are cross-sectional views of an interconnect feature during different stages of a dual damascene interconnect fabrication sequence. To best understand the invention, the reader should refer simultaneously to FIG. 1 and FIGS. 2A-B.

The method 100 begins at step 102 where a substrate 200 is provided having exposed low-k materials 220 and masking materials 222 that are to be removed. The substrate 200 may be any substrate, such as a silicon or other semiconductor substrate, and typically comprises a support layer 204 having at least one low-k material layer 202 formed thereon. The low-k material may be a carbon-doped dielectric material, such as carbon-doped silicon oxide (SiOC), organic polymers (such as polyimide, parylene), and the like.

A feature, such as a trench 212 and/or a via 210, is typically etched or otherwise formed into the low-k material layer 202, thereby exposing portions of the low-k material layer, such as sidewalls 216. A masking layer 208 is formed (e.g., deposited and patterned) over the low-k material layer 202 to facilitate etching the feature into the low-k material layer 202. The masking layer 208 may comprise a photoresist or other organic masking material, such as organic polymers. Optionally, a capping layer 206 may be disposed upon the low-k material layer 202 prior to forming the masking layer 208. The capping layer 206 may comprise thin oxide films and bonding films that help the oxide film adhere well to the low-k material 202. It is contemplated that the substrate 200 may comprise different or additional material layers and that features other than vias and trenches may be formed in the low-k material layer 202.

Next, at step 104 the masking layer 208 is exposed to a first plasma formed from a reducing chemistry. The reducing chemistry includes a passivation, or polymer deposition gas. The passivation gas may be a nitrogen-containing gas or a hydrogen-containing gas. In one embodiment, the passivation gas comprises at least one of ammonia ($NH_3$), hydrogen ($H_2$), methane ($CH_4$), nitrogen ($N_2$), and combinations thereof. The reducing chemistry utilized in the first plasma deposits a polymer upon the sidewalls of the feature, thereby protecting the sidewalls from damage due to the strip process. The reducing chemistry advantageously has a large operational window and produces a relatively small amount of low-k material damage to exposed surfaces, such as sidewalls 216, in comparison to other strip chemistries.

In one embodiment, the first plasma is formed at a chamber pressure in the range of from about 2 mTorr to about 300 mTorr by providing the passivation gas(es) at a total gas flow rate of from about 100 sccm to 1,000 sccm and providing power in the range of from about 50 to about 500 Watts. The masking layer 208 is exposed to the first plasma for a period of time between about 10 and about 1,000 seconds. In one embodiment, the process temperature is maintained between about 0-60 degrees Celsius.

After step 104, the method 100 proceeds to step 106, where the masking layer 208 is exposed to a second plasma formed from an oxidizing chemistry. The oxidizing chemistry comprises an oxygen-containing gas. In one embodiment, the oxygen-containing gas comprises at least one of oxygen ($O_2$), carbon monoxide (CO), carbon dioxide ($CO_2$), water vapor ($H_2O$), or combinations thereof. The oxidizing chemistry of the second plasma tends to have higher strip rate and better capability to remove photoresist and other organic masking materials than the reducing chemistry of the first plasma of step 104. In addition, the oxidizing chemistry of the second plasma is highly reactive with carbon and hydrogen disposed near the exposed surfaces of the low-k material layer 202. However, during step 106, the carbon and/or hydrogen removal from the exposed surfaces of the low-k materials is minimized due to the polymer deposition upon those surfaces during step 104.

In one embodiment, step 106 is performed at a chamber pressure less than or equal to approximately 100 mTorr and for a duration of between about 10 and about 300 seconds. In one embodiment, when the method is being practiced on extreme low-k (ELK) dielectric materials (e.g., materials having a dielectric constant below about 2.7), step 106 is performed at a chamber pressure of less than or equal to approximately 10 mTorr, or less than or equal to about 2 mTorr, for a duration of between about 10 and about 300 seconds. The low pressure environment maintains a collision-free plasma sheath, (i.e., the mean free path for particles in the plasma is much longer than the plasma sheath thickness). When charged particles are drawn to the substrate under the electrical potential of the plasma sheath and come into contact with etched feature, the charged particles come in almost nearly perpendicular to the substrate (i.e., an anisotropic etch condition) and have little chance to collide with other particles in the sheath. As such, the etched vertical sidewalls are under very minimal attack by charged particles. Under such process conditions, random attack by chemically active particles on the vertical sidewall of the feature is further reduced. A low total gas flow may also be maintained to advantageously further reduce sidewall damage by limiting the quantity of gas in the chamber. In one embodiment, the gas flow of the oxidizing chemistry in the process chamber is between about 10-500 sccm. In one embodiment, total gas flow in the chamber is less than approximately 200 sccm. The power supplied to the process chamber may also be minimized to sustain an oxidizing plasma having an the ion and neutral density that is as low as possible. In one embodiment, the RF power input to the chamber is less than approximately 200 Watts.

Optionally, the second plasma of step 106 may further comprise one or more inert diluent gas(es). The diluent gas may be added to the oxidizing chemistry in a diluent gas to oxidizing chemistry ratio of between about 1:1 and 5:1. In one embodiment, the inert diluent gas comprises at least one of helium (He), argon (Ar), and xenon (Xe). The addition of the inert diluent gas to the oxidizing chemistry of the second plasma advantageously dilutes the atomic oxygen density in the plasma, thereby reducing damage to the exposed low-k materials. The addition of the inert diluent gas further advantageously adds ion bombardment components to the plasma, thereby increasing the etch rate of the capping layer 206 (when present) and preventing cap overhang (a condition wherein the cap layer extends beyond the sidewall profile of the low-k material due to differences in the respective etch rates of the low-k materials and the cap layer).

Once step 106 is completed, step 104 may be repeated, as indicated by dashed line 108. The repetition of the method steps may continue until the masking layer 208 is completely removed. Otherwise, the method 100 ends and further processing of the substrate 200 may continue to complete fabrication of, for example, an integrated circuit.

Although the method 100 described above utilizes a plasma formed from a reducing chemistry (step 104) followed by a plasma formed from an oxidizing chemistry (step 106) to remove photo resist or organic materials, it is contemplated that the steps may be performed in reverse order. For example, if the method 100 is to be performed on a substrate 200 having exposed low-k materials that are more sensitive to damage from the oxidizing chemistry of step 106, then the method 100 may advantageously utilize the polymer-depositing reducing chemistry of step 104 as the first step. Alternatively, where the low-k materials are more robust, then the method 100 may advantageously begin with step 106 to more quickly remove the masking materials.

Figure 3:
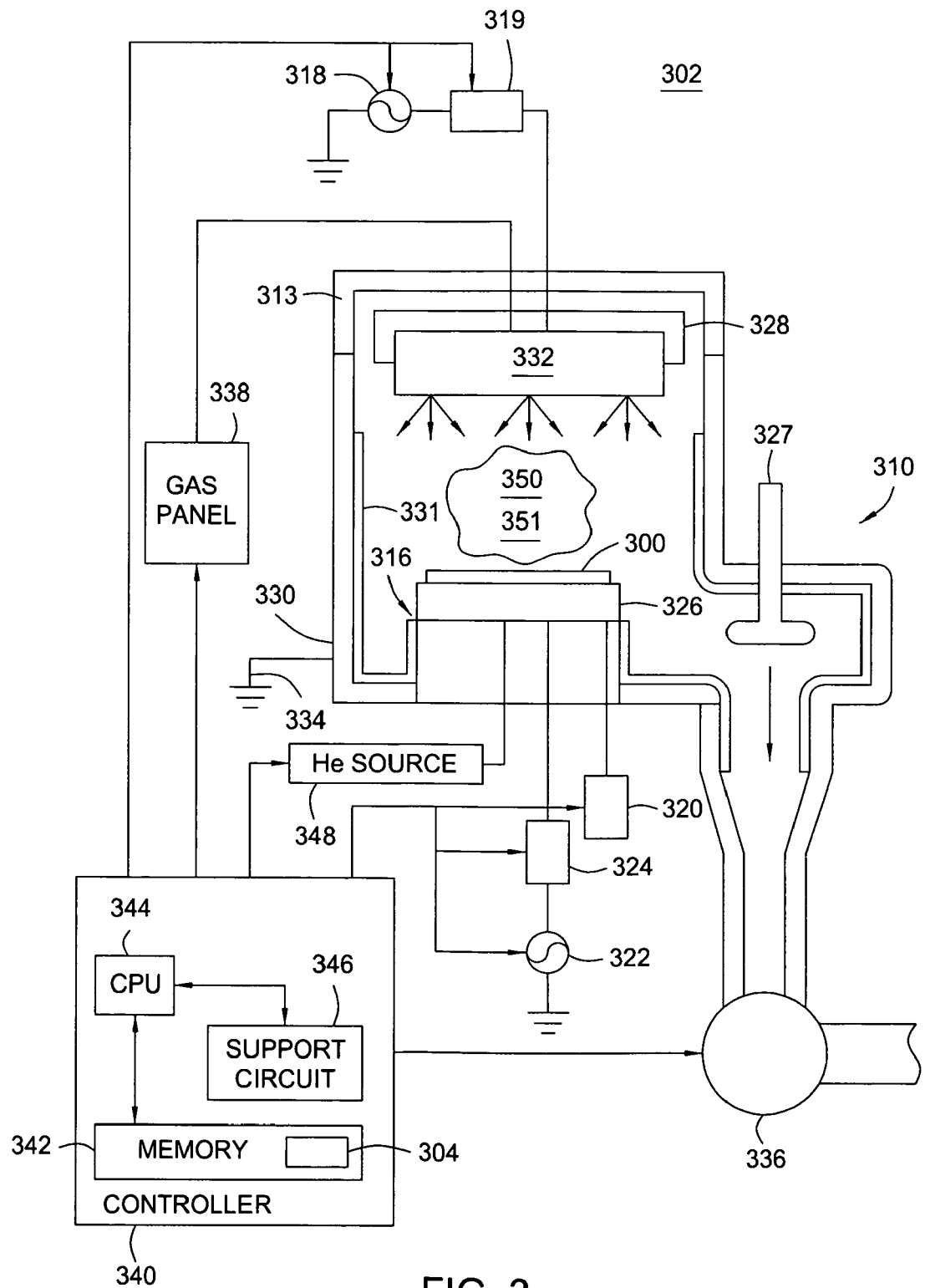
FIG. 3 is a schematic diagram of a process (etch) reactor that illustratively may be used to practice portions of the invention.

In one embodiment of the invention, the method 100 is practiced in an ENABLER® process reactor, commercially available from Applied Materials Inc, of Santa Clara, Calif., or other suitable process reactor. FIG. 3 depicts a schematic diagram of one suitable process (etch) reactor 302 that illustratively may be used to practice portions of the invention. The etch reactor 302 may generally be used as a processing module of the CENTURA® semiconductor wafer processing system available from Applied Materials, Inc. of Santa Clara, Calif.

The reactor 302 generally comprises a process chamber 310 and a controller 340. The chamber 310 is a high vacuum vessel supplied with controlled throttle valve 327 and vacuum pump 336. The process chamber 310 further comprises a conductive body (wall) 330, a lid assembly 313, a wafer support pedestal 316, and a ceramic liner 331. The lid assembly 313 generally comprises a showerhead 332 and an upper electrode 328. The showerhead 332 is mounted on the upper electrode 328 and may comprise several gas distribution zones such that various gases can be supplied to a reaction volume of the chamber 310 at specific flow rates. The upper electrode 328 is coupled to a very high frequency (VHF) source 318 through an impedance transformer 319 (e.g., a quarter-wavelength matching stub). The VHF source 318 is generally capable of producing up to 3,000 Watts at a tunable frequency of above about 100 MHz.

The support pedestal 316 comprises an electrostatic chuck 326 for retaining a substrate 300. In operation, the substrate 300 is placed on the support pedestal (i.e., cathode) 316. The electrostatic chuck 326 is controlled using a DC power supply 320. The support pedestal 316 through a matching network 324 is coupled to a bias source 322. The bias source 322 is generally capable of producing up to 5,000 W of radio-frequency (RF) power (i.e., cathode bias power) at a tunable frequency of about 50 kHz to 13.6 MHz. Optionally, the source 322 may be a source of DC or pulsed DC power.

The chamber wall 330 is generally formed from a metal (e.g., aluminum (Al), stainless steel, and the like) and coupled to an electrical ground terminal 334 of the reactor 302. The ceramic liner 331 facilitates in-situ cleaning of the process chamber 310.

The process gas(es) are supplied from a gas panel 338 to the process chamber 310 through the showerhead 332. The pressure of a gas mixture 350 in the process chamber 310 may be controlled using the gas panel 338 and/or the throttle valve 327. The gas mixture 350 may be ignited into a plasma 351 in the reaction volume of the chamber 310 by applying power from the VHF source 318.

Temperature of the substrate 300 is controlled by stabilizing the temperature of the electrostatic chuck 326 and flowing a helium (He) gas from a gas source 348 into the channels that are formed by the back side of the substrate 300 and grooves (not shown) in a surface of the electrostatic chuck 326. The helium gas facilitates a uniform heat transfer between the substrate 300 and electrostatic chuck 326. Using such thermal control, the substrate 300 may be maintained at a controlled temperature in a range from 10 to 500 degrees Celsius.

To facilitate control of the process chamber 310 as described above, the controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like.

The inventive method 100 is generally stored in the memory 342 as a software routine 304. The software routine 304 may also be stored and/or executed by a second CPU (not shown) that is remotely located from the hardware being controlled by the CPU 344. Some or all of the method steps of the present invention may also be performed in hardware. As such, the invention may be implemented in software and executed using a computer system, in hardware as, e.g., an application specific integrated circuit or other type of hardware implementation, or as a combination of software and hardware. The software routine 304, when executed by the CPU 344, causes the reactor 302 to perform processes of the present invention and is generally stored in the memory 342. The software routine 304 may also be stored and/or executed by a second CPU (not shown) that is remotely located from the hardware being controlled by the CPU 344.

The software routine 304 is executed after the substrate 300 is positioned on the pedestal 316. The software routine 304, when executed by the CPU 344, transforms the general purpose computer into a specific purpose computer (controller) 340 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Thus, a method for removing photoresist and other organic masking materials from a substrate while minimizing damage to exposed low-k materials is provided herein. Although the embodiments of the method are described above as being utilized in connection with the formation of a dual damascene structure, it is contemplated that the method 100 may be utilized in connection with any other IC device or structure fabrication process where it is desired to remove photoresist or other organic masking materials from a substrate having exposed low-k materials.

While the foregoing is directed to embodiments of the present invention, other and further embodiments of the invention may be devised without departing from the basic scope thereof, and the scope thereof is set forth by the following claims.

The invention claimed is:

1. A method for removing a masking material from a substrate within a process chamber, comprising:
   (a) providing a substrate having an exposed feature formed in a layer of low-k materials and an overlying layer of masking material to be removed;
   (b) exposing the layer of masking material to a first plasma formed from a reducing chemistry for a first period of time to deposit a polymer on sidewalls of the exposed feature;
   (c) exposing the layer of masking material to a second plasma formed from an oxidizing chemistry for a second period of time to partially remove the layer of masking material;
   (d) performing steps (b) and (c) sequentially; and
   (e) repeating steps (b) and (c) in the same order as initially performed until the layer of masking material is removed.

2. The method of claim 1, wherein the reducing chemistry comprises at least one of ammonia ($NH_3$), hydrogen ($H_2$), methane ($CH_4$), and nitrogen ($N_2$).

3. The method of claim 2, wherein the flow rate of the reducing chemistry is approximately 100-1000 sccm.

4. The method of claim 2, wherein the processing chamber is maintained at a pressure of between approximately 2 mTorr to 300 mTorr.

5. The method of claim 1, wherein the reducing chemistry comprises ammonia ($NH_3$).

6. The method of claim 1, wherein the oxidizing chemistry comprises at least one of oxygen ($O_2$), carbon monoxide (CO), carbon dioxide ($CO_2$), and water vapor ($H_2O$).

7. The method of claim 6, wherein the flow rate of the oxidizing chemistry is between approximately 10-500 sccm.

8. The method of claim 6, wherein the flow rate of the oxidizing chemistry is less than approximately 200 sccm.

9. The method of claim 6, wherein the processing chamber is maintained at a pressure of less than or equal to approximately 100 mTorr.

10. The method of claim 6, wherein the processing chamber is maintained at a pressure of less than or equal to approximately 10 mTorr.

11. The method of claim 6, wherein the processing chamber is maintained at a pressure of less than or equal to approximately 2 mTorr.

12. The method of claim 6, wherein the oxidizing chemistry comprises oxygen ($O_2$).

13. The method of claim 1, wherein the second plasma further comprises at least one diluent gas.

14. The method of claim 13, wherein the at least one diluent gas comprises at least one of helium (He), argon (Ar), and xenon (Xe).

15. The method of claim 13, wherein the diluent gas is provided in a ratio of diluent gas to oxidizing chemistry of between about 1:1 and 5:1.

16. The method of claim 1, wherein step (b) occurs prior to step (c).

17. The method of claim 1, wherein step (c) occurs prior to step (b).

18. The method of claim 1, wherein the first period of time is between about 10-1,000 seconds.

19. The method of claim 1, wherein the second period of time is between about 10-300 seconds.

20. A method for removing a masking material from a substrate within a process chamber, comprising:
(a) providing a substrate having an exposed feature formed in a layer of low-k materials and an overlying layer of masking material to be removed;
(b) performing one of:
(b1) exposing the layer of masking material to a first plasma formed from a reducing chemistry for a first period of time to deposit a polymer on sidewalls of the exposed feature; or
(b2) exposing the layer of masking material to a second plasma formed from an oxidizing chemistry for a second period of time to partially remove the masking layer;
(c) performing the step of (b1) or (b2) that was not performed in step (b); and
(d) repeating the step initially performed in step (b).

21. The method of claim 20, wherein the reducing chemistry comprises at least one of ammonia ($NH_3$), hydrogen ($H_2$), methane ($CH_4$), and nitrogen ($N_2$).

22. The method of claim 20, wherein the oxidizing chemistry comprises at least one of oxygen ($O_2$), carbon monoxide (CO), carbon dioxide ($CO_2$), and water vapor ($H_2O$).

23. The method of claim 20, wherein the second plasma further comprises at least one diluent gas comprising at least one of helium (He), argon (Ar), and xenon (Xe).

24. The method of claim 1, wherein the reducing chemistry comprises methane ($CH_4$).

25. The method of claim 20, wherein the reducing chemistry comprises methane ($CH_4$).

* * * * *